US012589463B2

(12) United States Patent
Rule et al.

(10) Patent No.: US 12,589,463 B2
(45) Date of Patent: Mar. 31, 2026

(54) POLISHING PADS AND SYSTEMS FOR AND METHODS OF USING SAME

(71) Applicant: 3M INNOVATIVE PROPERTIES COMPANY, St. Paul, MN (US)

(72) Inventors: Joseph D. Rule, Woodbury, MN (US); Duy K. Lehuu, Lake Elmo, MN (US); Eric C. Coad, Woodbury, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 513 days.

(21) Appl. No.: 18/000,887

(22) PCT Filed: Jun. 24, 2021

(86) PCT No.: PCT/IB2021/055629
§ 371 (c)(1),
(2) Date: Dec. 6, 2022

(87) PCT Pub. No.: WO2021/260629
PCT Pub. Date: Dec. 30, 2021

(65) Prior Publication Data
US 2023/0211455 A1 Jul. 6, 2023

Related U.S. Application Data

(60) Provisional application No. 62/705,393, filed on Jun. 25, 2020.

(51) Int. Cl.
*B24B 37/24* (2012.01)
*B24B 37/22* (2012.01)
(Continued)

(52) U.S. Cl.
CPC .............. *B24B 37/24* (2013.01); *B24B 37/22* (2013.01); *B24B 37/26* (2013.01); *H01L 21/02013* (2013.01)

(58) Field of Classification Search
CPC ......... B24B 37/24; B24B 37/26; B24B 37/22; B24B 37/04; B24B 37/20; B24D 3/32;
(Continued)

(56) References Cited

U.S. PATENT DOCUMENTS 6,410,638 B1 6/2002 Kaufhold et al.
6,736,709 B1 5/2004 James et al.
(Continued)

FOREIGN PATENT DOCUMENTS

EP 1138438 B1 8/2006
JP 2011125934 A 6/2011
(Continued)

OTHER PUBLICATIONS

Gary Foster, What is Dynamic mechanical analysis, Dec. 5, 2018, https://web.archive.org/web/20181205130005/https://coventivecomposites.com/explainers/dynamic-mechanical-analysis-dma/ (Year: 2018).*
(Continued)

*Primary Examiner* — Robert F Neibaur
(74) *Attorney, Agent, or Firm* — Jonathan L. Tolstedt

(57) ABSTRACT
A polishing pad includes a textured polishing layer comprising a working surface and a second surface opposite the working surface. The textured polishing layer comprises a polymeric blend comprising thermoplastic urethane in an amount of between 40 and 95 wt. %, and styrenic copolymer in an amount of between 5 and 60 wt. %, based on the total weight of the textured polishing layer.

13 Claims, 2 Drawing Sheets

(51) Int. Cl.

| | | |
|---|---|---|
| *B24B 37/26* | (2012.01) | |
| *H01L 21/02* | (2006.01) | |

(58) Field of Classification Search
CPC ........ B24D 3/26; B24D 11/02; B24D 13/147; B24D 2203/00; H01L 21/304; B32B 27/40; B32B 2266/0278
USPC ............. 451/41, 539, 287, 290, 298; 51/296
See application file for complete search history.

(56) References Cited

U.S. PATENT DOCUMENTS

| | | | |
|---|---|---|---|
| 8,128,779 B2 | 3/2012 | Ho et al. | |
| 8,634,146 B2 | 1/2014 | David et al. | |
| 10,071,461 B2 | 9/2018 | Lehuu et al. | |
| 2004/0063391 A1* | 4/2004 | Hosaka | C08L 23/0853 |
| | | | 451/526 |

| | | | |
|---|---|---|---|
| 2013/0012108 A1 | 1/2013 | Li et al. | |
| 2017/0173758 A1 | 6/2017 | Lehuu et al. | |
| 2018/0281148 A1* | 10/2018 | Lehuu | B24D 3/28 |

FOREIGN PATENT DOCUMENTS

| | | | |
|---|---|---|---|
| JP | 2011151373 A | 8/2011 | |
| JP | 2015226940 A * | 12/2015 | |
| WO | 2015013387 A1 | 1/2015 | |

OTHER PUBLICATIONS

Machine translation of JP-2015226940-A (Year: 2015).*
Demma, "Morphology and Properties of Polyurethane-Based Blends", Journal of Materials Science, Jan. 1983, vol. 18, pp. 89-102.
International Search Report for PCT Application No. PCT/IB2021/055629. mailed on Sep. 27, 2021, 4 pages.
Khanna, "Impact of Pad Material Properties on CMP Performance for Sub-10nm Technologies", ECS Journal of Solid State Science and Technology, 2019, vol. 8, No. 5, pp. P3063-P3068.

* cited by examiner

POLISHING PADS AND SYSTEMS FOR AND METHODS OF USING SAME

CROSS REFERENCE TO RELATED APPLICATIONS

This application is a national stage filing under 35 U.S.C. 371 of PCT/IB2021/055629, filed Jun. 24, 2021, which claims the benefit of Provisional Application No. 62/705,393, filed Jun. 25, 2020.

FIELD

The present disclosure relates to polishing pads useful for the polishing of substrates, and systems for and methods of using such polishing pads.

BRIEF DESCRIPTION OF THE DRAWINGS

The disclosure may be more completely understood in consideration of the following detailed description of various embodiments of the disclosure in connection with the accompanying figures, in which.

DETAILED DESCRIPTION

Figure 1A:
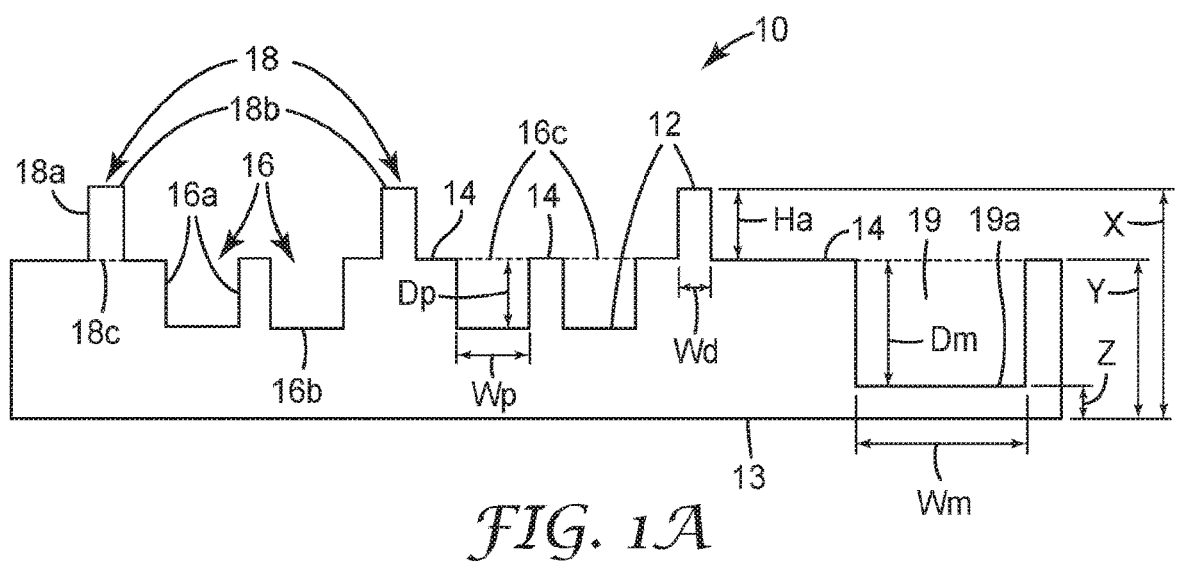
FIG. 1A is a schematic cross-sectional diagram of a portion of a textured polishing layer in accordance with some embodiments of the present disclosure.

Various articles, systems and methods have been employed for the polishing of substrates. The polishing articles, systems and methods are selected based on the desired end use characteristics of the substrates such as surface finish, (e.g., surface roughness and defects (e.g., scratches, pitting and the like)), and planarity, including both local planarity (i.e., planarity in a specific region of the substrate) and global planarity, (i.e., planarity across the entire substrate surface). The polishing of substrates such as semiconductor wafers presents particularly difficult challenges, as end-use requirements may be extremely stringent due to the micron-scale and even nanometer-scale features that need to be polished to a required specification. Often, along with improving or maintaining a desired surface finish, the polishing process also requires material removal, which may include material removal within a single substrate material or simultaneous material removal of a combination of two or more different materials, within the same plane or layer of the substrate. Materials that may be polished alone or simultaneously include both electrically insulating materials (e.g., dielectrics) and electrically conductive materials (e.g., metals). For example, during a single polishing step involving barrier layer chemical mechanical planarization (CMP), the polishing pad may be required to remove metal (e.g., copper), and/or adhesion/barrier layers and/or cap layers (e.g., tantalum and tantalum nitride), and/or dielectric materials (e.g., an inorganic material, such as, silicone oxide or other glasses). Due to the differences in the material properties and polishing characteristics between the dielectric layers, metal layers, adhesion/barrier and/or cap layers, combined with the wafer feature sizes to be polished, the demands on the polishing pad can be extreme.

Often in CMP polishing, polymeric polishing pads are employed in combination with an abrasive inorganic slurry to remove the required material from the substrate. Conventional polishing pads for CMP are based on foams but, more recently, microreplicated polishing pads have been developed. For such microreplicated polishing pads in particular, a faster removal rate is desirable to increase the throughput of the CMP process.

Generally, polishing pad materials with controlled hardness are desirable for consistent performance. During the polishing process, however, the temperature of the pad can increase, at least partially due to the friction between the pad and the substrate. With polymeric materials, the increase in temperature will result in a decrease in the modulus and hardness of the pad material. This decrease in hardness and modulus can cause undesirable variations in polishing performance. Consequently, polishing pad materials that mitigate or eliminate the decrease in hardness and modulus may be desirable. Among the various classes of polymers useful in polishing pads, urethane materials are particularly useful for CMP polishing applications, at least partially because of their toughness. Customarily, increase of the modulus of a urethane beyond about 30 MPa is carried out by an increase its hard segment level. This increase in hard segment content can provide a room-temperature modulus in the targeted range of 30 MPa to 1000 MPa, but this also usually requires an increase of the glass transition temperature to the point where the glass transition is near 25° C. The glass transition inherently involves a significant change in modulus with temperature, which is undesirable for CMP applications when it is near 25° C. Therefore, the typical approach of using hard segment content to access moduli between 30 MPa ad 1000 MPa is sub-optimal for the preparation of CMP pads with consistent polishing performance.

The level of a materials variation in modulus with temperature can be quantified by the ratio of the tensile modulus at 25° C. (E'25) over the tensile modulus at 60° C. (E'60). The tensile modulus can be determined with Dynamic Mechanical Analysis (DMA) temperature ramp tests. In DMA temperature ramp tests, polymeric materials will often display a glassy plateau where the modulus is relatively stable over a significant temperature range. The typical moduli seen in the glassy plateau will fall between about 3000 MPa and 1000 MPa. Polymeric materials will also often display a rubbery plateau over a significant temperature range. The typical moduli seen in the rubbery plateau will fall between about 1 MPa and 30 MPa. Between the glassy plateau and rubbery plateau, the polymeric material will often show a relatively sharp transition in modulus with temperature (e.g., a glass transition or a melt transition). Consequently, the identification of materials for the working layer of polishing pads that have a relatively stable modulus in the temperature range of 25° C. to 60° C. with moduli in the range from about 1000 MPa to 30 MPa, which is typically a transitional modulus level, may be desirable.

Generally, the present disclosure is directed to the discovery of such materials. In this regard, it has been discovered that certain blends of a thermoplastic polyurethane with certain styrenic polymers can produce polishing pads with a relatively stable modulus between 25° C. and 60° C. while having moduli in this temperature range between about 30 MPa and 1000 MPa.

Definitions

As used herein, the singular forms "a", "an", and "the" include plural referents unless the content clearly dictates otherwise. As used in this specification and the appended embodiments, the term "or" is generally employed in its sense including "and/or" unless the content clearly dictates otherwise.

As used herein, the recitation of numerical ranges by endpoints includes all numbers subsumed within that range (e.g. 1 to 5 includes 1, 1.5, 2, 2.75, 3, 3.8, 4, and 5).

Unless otherwise indicated, all numbers expressing quantities or ingredients, measurement of properties and so forth used in the specification and embodiments are to be understood as being modified in all instances by the term "about." Accordingly, unless indicated to the contrary, the numerical parameters set forth in the foregoing specification and attached listing of embodiments can vary depending upon the desired properties sought to be obtained by those skilled in the art utilizing the teachings of the present disclosure. At the very least, and not as an attempt to limit the application of the doctrine of equivalents to the scope of the claimed embodiments, each numerical parameter should at least be construed in light of the number of reported significant digits and by applying ordinary rounding techniques.

"Working surface" refers to the surface of a polishing pad that will be adjacent to and in at least partial contact with the surface of the substrate being polished.

"Pore" refers to a cavity in the working surface of a pad that allows a fluid, e.g. a liquid, to be contained therein. The pore enables at least some fluid to be contained within the pore and not flow out of the pore.

"Precisely shaped" refers to a topographical feature, e.g. an asperity or pore, having a molded shape that is the inverse shape of a corresponding mold cavity or mold protrusion, said shape being retained after the topographical feature is removed from the mold.

"Micro-replication" refers to a fabrication technique wherein precisely shaped topographical features are prepared by casting or molding a polymer (or polymer precursor that is later cured to form a polymer) in a production tool, e.g. a mold or embossing tool, wherein the production tool has a plurality of micron sized to millimeter sized topographical features. Upon removing the polymer from the production tool, a series of topographical features are present in the surface of the polymer. The topographical features of the polymer surface have the inverse shape as the features of the original production tool. The micro-replication fabrication techniques disclosed herein inherently result in the formation of a micro-replicated layer, i.e. a textured polishing layer, which includes micro-replicated asperities, i.e. precisely shaped asperities, when the production tool has cavities, and micro-replicated pores, i.e. precisely shaped pores, when the production tool has protrusions. If the production tool includes cavities and protrusions, the micro-replicated layer (textured polishing layer) will have both micro-replicated asperities, i.e. precisely shaped asperities, and micro-replicated pores, i.e. precisely shaped pores.

"Thermoplastic polyurethane" refers to a polyurethane that becomes a liquid at elevated temperature, such as a temperature range within the range of 100° C. to 250° C. Thermoplastic polyurethanes are preferably not crosslinked, and in the liquid state the tan delta value measured by dynamic mechanical analysis (DMA) becomes greater than 1.0. At cooler temperatures, such as below 100° C., the thermoplastic polyurethane becomes a solid, and the tan delta value measured by DMA is less than 1.0. Thermoplastic polyurethanes can be made by reacting monomers with the appropriate ratios and functionalities such that the polymer does not form a gel. In systems with only difunctional monomers and monofunctional monomers, the polymer is expected to not form a gel. Systems with trifunctional monomers or higher functionality monomers can form a gel.

The present disclosure is directed to articles, systems, and methods useful for polishing substrates, including but not limited to, semiconductor wafers.

In some embodiments, the present disclosure is directed to polishing pads, which may be formed as multi-layer structures having a working layer (i.e., layer intended to contact that substrate to be polished) and one or more additional layers (e.g., subpad layers, foam layers) that are coupled to one another via a suitable fastening mechanism (e.g., adhesive). In some embodiments, the working layers of the present disclosure may be textured polishing layers. While not intending to be limiting, the present disclosure is primarily directed to two types of textured polishing layers: microreplicated polishing layers and porous foam polishing layers.

Figure 1B:
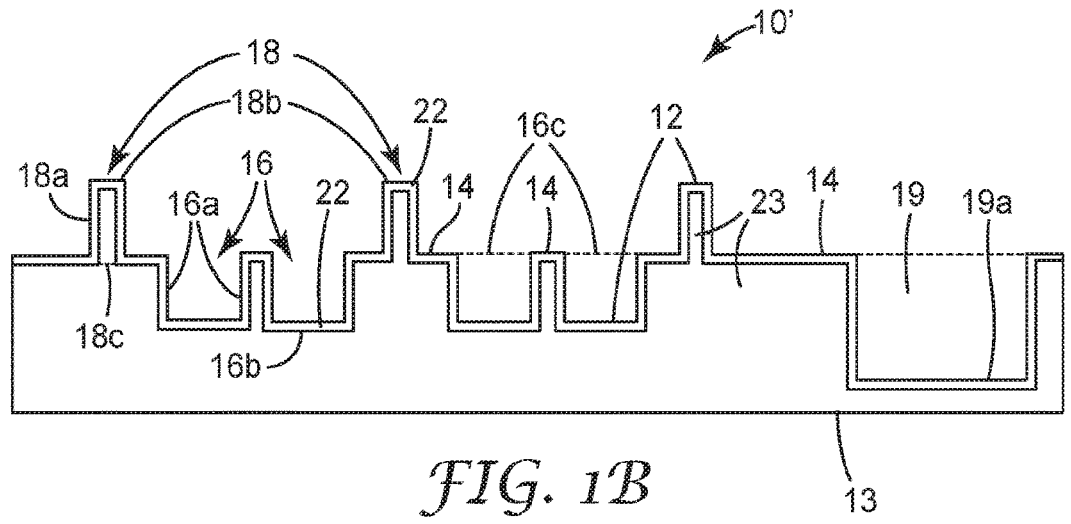
FIG. 1B is a schematic cross-sectional diagram of a portion of a textured polishing layer, in accordance with some embodiments of the present disclosure.
Figure 1C:
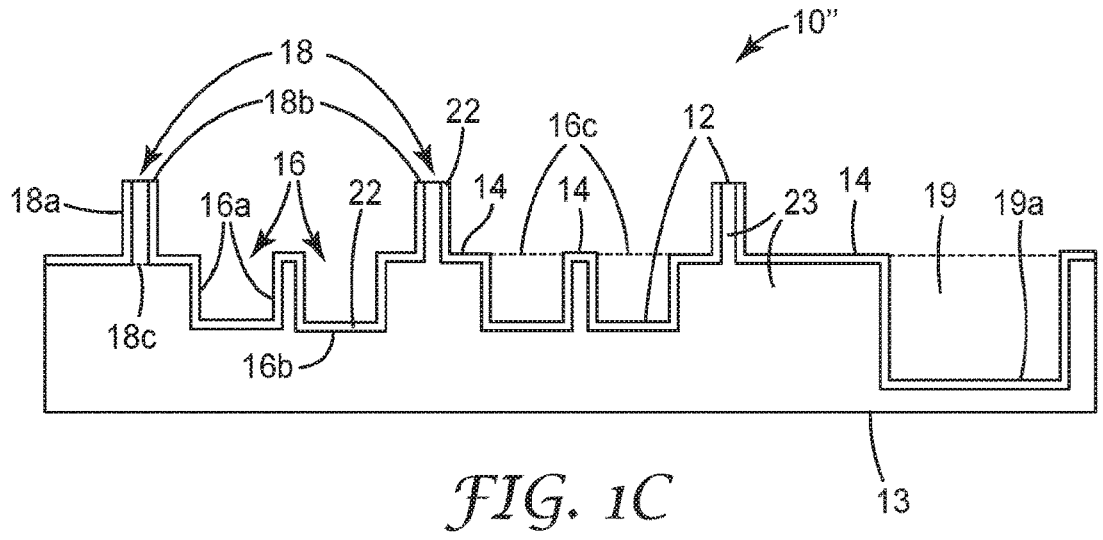
FIG. 1C is a schematic cross-sectional diagram of a portion of a textured polishing layer, in accordance with some embodiments of the present disclosure.

Referring now to FIGS. 1A to 1C, in some embodiments, the present disclosure is directed to a textured polishing layer that includes a plurality of precisely shaped pores and/or a plurality of precisely shaped asperities (such polishing layers may also be referred to herein as a microreplicated polishing layer). A schematic cross-sectional diagram of a portion of a textured polishing layer 10 according to some embodiments of the present disclosure is shown in FIG. 1A. Textured polishing layer 10 includes working surface 12 (i.e., surface of the polishing layer 10 intended to contact the substrate to be polished) and second surface 13 opposite working surface 12. Working surface 12 may be a precisely engineered surface having precisely engineered topography. Working surface 12 may include a plurality of precisely shaped pores 16 or a plurality of precisely shaped asperities 18 having distal ends 18b. Land regions 14 are located in regions between precisely shaped pores 16 and precisely shaped asperities 18 and may be considered part of the working surface. The textured layer 10 may also include a macro-channel 19.

The shape of precisely shaped pores 16 is not particularly limited and includes, but is not limited to, cylinders, half spheres, cubes, rectangular prism, triangular prism, hexagonal prism, triangular pyramid, 4, 5 and 6-sided pyramids, truncated pyramids, cones, truncated cones and the like. The lowest point of a precisely shaped pore 16, as measured from the land region, is considered to be the bottom of the pore. The intersection of a precisely shaped pore sidewall 16a with the land region 14 is considered to be the top of the pore. The shape of all the precisely shaped pores 16 may all be the same or combinations may be used. The longest dimension of the precisely shaped pore 16, in the plane of the land region 14, e.g. the diameter when the precisely shaped pores 16 are cylindrical in shape, may be less than about 10 mm, less than about 5 mm, less than about 1 mm, less than about 500 microns, less than about 200 microns, less than about 100 microns, less than about 90 microns, less than about 80 microns, less than about 70 microns or even less than about 60 microns.

The depth of the precisely shaped pores 16 may be may be less than about 5 mm, less than about 1 mm, less than about 500 microns, less than about 200 microns, less than about 100 microns, less than about 90 microns, less than about 80 microns, less than about 70 microns or even less than about 60 microns. The precisely shaped pores 16 may be uniformly distributed, i.e. have a single areal density, across the surface of the textured polishing layer 10 or may have different areal density across the surface of the textured polishing layer 10. The areal density of the precisely shaped pores 16 may be less than about 1,000,000/mm$^2$, less than about 500,000/mm$^2$, less than about 100,000/mm$^2$, less than about 50,000/mm$^2$, less than about 10,000/mm$^2$, less than about 5,000/mm$^2$, less than about 1,000/mm$^2$, less than about 500/mm$^2$, less than about 100/mm$^2$, less than about 50/mm$^2$, less than about 10/mm$^2$, or even less than about 5/mm$^2$.

The precisely shaped pores 16 may be arranged randomly across the surface of textured polishing layer 10 or may be arranged in a pattern across textured polishing layer 10. Patterns include, but are not limited to, square arrays, hexagonal arrays and the like. Combination of patterns may be used.

The shape of precisely shaped asperities 18 is not particularly limited and includes, but is not limited to, cylinders, half spheres, cubes, rectangular prism, triangular prism, hexagonal prism, triangular pyramid, 4, 5 and 6-sided pyramids, truncated pyramids, cones, truncated cones and the like. The intersection of a precisely shaped asperity sidewall 18a with the land region 14 is considered to be the base of the asperity. The highest point of a precisely shaped asperity 18, as measured from the land region, is considered to be the top of the asperity. The height of a precisely shaped asperity is considered to be from the base of the asperity to the top of the asperity. The shape of all the precisely shaped asperities 18 may all be the same or combinations may be used.

The longest dimension of the precisely shaped asperities 18, in the plane of the land region 14, e.g. the diameter when the precisely shaped asperities 18 are cylindrical in shape, may be less than about 10 mm, less than about 5 mm, less than about 1 mm, less than about 500 microns, less than about 200 microns, less than about 100 microns, less than about 90 microns, less than about 80 microns, less than about 70 microns or even less than about 60 microns. The height of the precisely shaped asperities 18 may be may be less than about 5 mm, less than about 1 mm, less than about 500 microns, less than about 200 microns, less than about 100 microns, less than about 90 microns, less than about 80 microns, less than about 70 microns or even less than about 60 microns. The height of the precisely shaped asperities 18 may be greater than about 1 micron, greater than about 5 microns, greater than about 10 microns, greater than about 15 microns or even greater than about 20 microns. The precisely shaped asperities 18 may all have the same height or the height may vary between precisely shaped asperities 18 or between sets of different precisely shaped asperities 18.

The precisely shaped asperities 18 may be uniformly distributed, i.e. have a single areal density, across the surface of the textured polishing layer 10 or may have different areal density across the surface of the textured polishing layer 10. The areal density of the precisely shaped asperities 18 may be less than about 1,000,000/mm$^2$, less than about 500,000/mm$^2$, less than about 100,000/mm$^2$, less than about 50,000/mm$^2$, less than about 10,000/mm$^2$, less than about 5,000/mm$^2$, less than about 1,000/mm$^2$, less than about 500/mm$^2$, less than about 100/mm$^2$, less than about 50/mm$^2$, less than about 10/mm$^2$, or even less than about 5/mm$^2$. The areal density of the precisely shaped asperities 18 may be greater than about 1/dm$^2$, may be greater than about 10/dm$^2$, greater than about 100/dm$^2$, greater than about 5/cm$^2$, greater than about 10/cm$^2$, greater than about 100/cm$^2$, or even greater than about 500/cm$^2$.

The precisely shaped asperities 18 may be arranged randomly across the surface of textured polishing layer 10 or may be arranged in a pattern across textured polishing layer 10. Patterns include, but are not limited to, square arrays, hexagonal arrays and the like. Combination of patterns may be used.

The textured polishing layer may include one or more macro-channels or macro-grooves (e.g., macro-channel 19 of FIGS. 1A-1C. The macro-channels may provide improved polishing solution distribution as well as facilitate swarf removal from the polishing pad. Unlike pores, the macro-channels or macro-grooves do not allow fluid to be contained indefinitely within the macro-channel—fluid can flow out of the macro-channel during use of the pad. The macro-channels are generally wider and have a greater depth than the precisely shaped pores. The width of the macro-channels may be greater than about 10 microns, greater than about 50 microns or even greater than about 100 microns. The width of the macro-channels may be less than about 10 mm, less than about 5 mm, may be less than about 2 mm, less than about 1 mm, less than about 500 microns or even less than about 200 microns. The depth of the macro-channels may be greater than about 50 microns, greater than about 100 microns, greater than about 500 microns or even greater than about 1,000 microns. In some embodiments, the depth of the macro-channels is no greater than the thickness of the textured polishing layer. The depth of the macro-channels may be less than about 10 mm, less than about 5 mm, less than about 2.5 mm or even less than about 1 mm. The macro-channels may be formed into the textured polishing layer by any known techniques in the art including, but not limited to, machining. In some embodiments, the macro-channels are fabricated in the embossing process used to form the precisely shaped pores and/or asperities. This is achieved by forming their negative, i.e. raised regions, in the master tool, with the macro-channels themselves then being formed in the textured polishing layer during embossing. The macro-channels can be fabricated to form various patterns known in the art, including but not limited to concentric rings, parallel lines, radial lines, a series of lines forming a grid array, spiral and the like. Combinations of differing patterns may be used.

The working surface of the textured polishing layer may further include nanometer-size topographical features on the surface of the textured polishing layer. As used herein, "nanometer-size topographical features" refers to regularly or irregularly shaped domains having a length or longest dimension no greater than about 1,000 nm. In some embodiments, the precisely shaped asperities, the precisely shaped pores, the land region or any combination thereof includes nanometer-size topographical features on their surface. In one embodiment, the precisely shaped asperities, the precisely shaped pores and the land region include nanometer-size topographical features on their surfaces. It is thought that this additional topography increases the hydrophilic properties of the pad surface, which is believed to improve slurry distribution, wetting and retention across the polishing pad surface. The nanometer-size topographical features can be formed by any known method in the art, including, but not limited to, plasma processing, e.g. plasma etching, and wet chemical etching, Plasma processes include processes described in U.S. Pat. No. 8,634,146 (David, et. al.)

and U.S. Provisional Appl. No. 61/858,670 (David, et. al.), which are incorporated herein by reference in their entirety.

In some embodiments, the nanometer-size features may be regularly shaped domains, i.e. domains with a distinct shape such as circular, square, hexagonal and the like, or the nanometer-size features may be irregularly shaped domains. The domains may be arranged in a regular array, e.g. hexagonal array or square array, or they may be in a random array. In some embodiments, the nanometer-size topographical features on the working surface of the textured polishing layer may be a random array of irregularly shaped domains. One of the benefits of including the nanometer-size topographical features on the precisely shaped asperity surfaces as well as the precisely shaped pore surfaces and/or land region surfaces is that, if the nanometer-size topographical features are worn away from the surface of the asperities during the polishing process (see FIG. 1C), the positive benefits of the nanometer-size topographical features, which include increasing the hydrophilic properties across the pad surface, i.e. working surface of the textured polishing layer, can be maintained, as the nanometer-size topographical features will not be worn away from the precisely shaped pore surfaces and/or land region surfaces during polishing. Thus, a textured polishing layer can be obtained having the surprising effect of good surface wetting characteristics even though the precisely shaped asperities surfaces in contact with the substrate being polished, i.e. the precisely shaped asperities' distal ends may have poor wetting characteristics.

In some embodiments, surface modification techniques, which may include the formation of nanometer-size topographical features, may be used to chemically alter or modify the working surface of the textured polishing layer. The portion of the working surface of the textured polishing layer that is modified, e.g. that includes nanometer size topographical features, may be referred to as a secondary surface layer. The remaining portion of the textured polishing layer that is unmodified may be referred to as a bulk layer. FIG. 1B shows a textured polishing layer 10' which is nearly identical to that of FIG. 1A, except the textured polishing layer 10' includes a secondary surface layer 22 and corresponding bulk layer 23. In this embodiment, the working surface includes a secondary surface layer 22, i.e. the region of the surface that has been chemically altered, and a bulk layer 23, i.e. the region of the working surface adjacent the secondary surface layer which has not been chemically altered. As shown in FIG. 1B, the distal ends 18b of precisely shaped asperities 18 are modified to include secondary surface layer 22. In some embodiments, the chemical composition in at least a portion of the secondary surface layer 22 differs from the chemical composition within the bulk layer 23, e.g. the chemical composition of the polymer in at least a portion of the outer most surface of the working surface is modified, while the polymer beneath this modified surface has not been modified. Surface modifications may include those known in the art of polymer surface modification, including chemical modification with various polar atoms, molecules and/or polymers.

In some embodiments, the hardness of textured polishing layer 10 may be greater than about 20 Shore D, greater than about 30 Shore D or even greater than about 40 Shore D. The hardness of textured polishing layer 10 may be less than about 90 Shore D, less than about 80 Shore D or even less than about 70 Shore D. The hardness of textured polishing layer 10 may be greater than about 20 Shore A, greater than about 30 Shore A or even greater than about 40 Shore A. The hardness of textured polishing layer 10 may be less than about 95 Shore A, less than about 80 Shore A or even less than about 70 Shore A.

In some embodiments, the microreplicated textured polishing layers of the present disclosure may be of the types described in U.S. Pat. No. 10,071,461, which is herein incorporated by reference in its entirety.

In some alternative embodiments, the textured polishing layers of the present disclosure may be formed as semi-rigid or rigid microporous materials (e.g., a foam). Such polishing layers may have any or all of a porosity of between 10 and 90%, between 30 and 70%, or between 40 and 60%. Such polishing layers may have a hardness of between 0 shore A and 100 shore D or between 40 shore A and 75 shore D. Such polishing layers may have an average pore size of between 1 μm and 200 μm or between 30 μm and 60 μm. In some embodiments, the polishing pads of this type may be produced as an extruded foam.

In some embodiments, the semi-rigid or rigid microporous textured polishing layers of the present disclosure may further include at least one channel, wherein the channel has a depth greater than the distance the foam features extend from or into the first major surface of the textured polishing layer. The channel may provide improved polishing solution distribution, polymeric foam layer flexibility as well as facilitate swarf removal from the polishing pad. In some embodiments, the channels do not allow fluid to be contained indefinitely within the channel, i.e. fluid can flow out of the channel during use of the pad. The width of the channels may be greater than about 10 microns, greater than about 50 microns or even greater than about 100 microns. The width of the channels may be less than about 10 mm, less than about 5 mm, may be less than about 2 mm, less than about 1 mm, less than about 500 microns or even less than about 200 microns. The depth of the channels may be greater than about 50 microns, greater than about 100 microns, greater than about 500 microns or even greater than about 1,000 microns. In some embodiments, the depth of the channels is no greater than the thickness of the textured polishing layer. The depth of the channels may be less than about 10 mm, less than about 5 mm, less than about 2.5 mm or even less than about 1 mm. The channels may be formed into the textured polishing layer by any known techniques in the art including, but not limited to, machining, embossing and molding.

In some embodiments, the textured polishing layers of the present disclosure may be formed of a polymeric blend that includes at least a thermoplastic urethane and a styrenic copolymer.

In some embodiments, suitable thermoplastic urethanes include aromatic polyester polyurethanes, aromatic polyether polyurethanes, aliphatic polyester polyurethanes, or aliphatic polyether polyurethanes. Suitable thermoplastic polyurethanes can have a weight average molecular weight (Mw) of from 25,000 to 400,000 g/mol, or from 40,000 to 200,000 g/mol, as determined, for example, by gel permeation chromatography (GPC) using polystyrene standards.

In some embodiments, useful thermoplastic polyurethanes include, for example, those sold under the tradenames ESTANE, PELLETHANE, and PEARLTHANE from Lubrizol Advanced Materials, Inc., Cleveland, Ohio; AVALON, IROGRAN, and KRYSTALGRAN from Huntsman Polyurethanes (an international business unit of Huntsman International LLC), The Woodlands, Texas; ELASTOLLAN from BASF Corporation, Florham Park, N.J.; and TEXIN from Covestro Corporation, Pittsburgh, Pennsylvania.

In some embodiments, the thermoplastic polyurethanes can be the reaction product of, for example, a first resin comprising at least two isocyanate groups and a second resin that has at least two groups that are reactive with isocyanate groups.

In some embodiments, the first resin comprising at least two isocyanate groups can be chosen from isocyanate functional monomers, isocyanate functional prepolymers and combinations thereof. In some embodiments, the second resin that has at least two groups that are reactive with isocyanate groups can be chosen from a wide variety of materials. In some embodiments, the second resin has functional groups chosen from hydroxyl, mercapto, primary amine, secondary amine and combinations thereof.

In some embodiments, particularly suitable thermoplastic materials can be reaction products of, for example, a first resin comprising 4,4'-diphenylmethane diisocyanate or a prepolymer made with 4,4'-diphenylmethane diisocyanate and a second resin comprising 1,4-butanediol, poly(tetramethylene ether) glycol, polyester polyols, and mixtures thereof.

In some embodiments, the thermoplastic polyurethanes of the present disclosure may be the reaction product of the resins described in U.S. Pa. App. Pub. 2013/0012108, which is herein incorporated by reference in its entirety.

In some embodiments, suitable styrenic copolymers may include (or consist essentially of) styrene acrylonitrile copolymers (SAN) or Acrylonitrile Butadiene Styrene copolymers (ABS). In some embodiments, suitable styrenic copolymers have at least 10% styrene, at least 30% styrene, or at least 50% styrene, based on the total weight of the copolymers monomeric units. In some embodiments, suitable styrenic compolymers have at least 5% acrylonitrile, at least 10% acrylonitrile, or at least 20% acrylonitrile, based on total weight of the copolymers monomeric units.

In some embodiments, the thermoplastic urethanes may be present in the textured polishing layer in an amount of between 40 and 95 wt. %, between 50 and 90 wt. %, or between 55 and 85 wt. %, based on the total weight of the textured polishing layer; and the styrenic copolymers may be present in the textured polishing layer in an amount of between 5 and 60 wt. %, between 10 and 50 wt. %, or between 15 and 45 wt. %, based on the total weight of the textured polishing layer.

In some embodiments, the styrenic copolymer may exist in separate domains from the thermoplastic urethane, such that the glass transition temperature of the urethane and the glass transition of the styrenic copolymer are both present in the material. When the glass transition of the urethane is below 25° C. and the glass transition of the styrenic polymer is above 60° C., a plateau modulus is established between 25° C. and 60° C. where the urethane material is in its rubbery plateau and the styrenic material is in its glassy plateau. This results in a modulus for the phase-separated blended material in the intermediate range of about 30 MPa to 1000 MPa between 25° C. and 60° C. at a frequency of 1 hertz.

In embodiments where the textured polishing layer is a microreplicated polishing layer, the size of the styrenic domains may be in a range that is significantly smaller than the microreplicated features (e.g., the longest dimension of a precisely shaped pore or asperity) present on the working surface of the textured polishing layer. For example, in some embodiments, the average size (in terms of average longest dimension) of the styrenic domains may range from 0.5-40 microns, 1-20 microns, or 1-10 microns. In this manner, each microreplicated feature will contain a plurality of styrenic domains such that the average composition of each microreplicated feature will be similar. Furthermore, it is to be appreciated that the composition of each microreplicated feature will remain fairly constant as the feature is worn down with use. In contrast, if the discrete domains of the polymer blend were larger, such that the size became more similar to the size of the microreplicated features, then each feature would contain only a small number of large harder domains or no harder domains at all. This could lead to variable hardness feature-to-feature, which may be bad for consistent polishing performance and defect minimization.

In some embodiments, the polymeric blends of the textured polishing layer may have an E'25/E'60 of less than 4.5, less than 3.0, or less than 2.5 and greater than 1 or greater than 1.2; and a tensile moduli between 10 MPa and 1000 MPa, 30 MPa and 1000 MPa, or between 70 and 800 MPa, in the temperature range of 25° C. to 60° C. at a frequency of 1 hertz.

In some embodiments, the textured polishing layer 10 is substantially free of any inorganic abrasive material (e.g. abrasive particles), i.e. it is an abrasive free polishing pad. By substantially free it is meant that the textured polishing layer 10 includes less than about 10% by volume less than about 5% by volume, less than about 3% by volume, less than about 1% by volume or even less than about 0.5% by volume inorganic abrasive particles. In some embodiments, the textured polishing layer 10 contains substantially no inorganic abrasive particles. An abrasive material may be defined as a material having a Mohs hardness greater than the Mohs hardness of the substrate being abraded or polished. An abrasive material may be defined as having a Mohs hardness greater than about 5.0, greater than about 5.5, greater than about 6.0, greater than about 6.5, greater than about 7.0, greater than about 7.5, greater than about 8.0 or even greater than about 9.0

The textured polishing layer thickness is not particularly limited, except the thickness may coincide with the required thickness to enable polishing on the appropriate polishing tool. In some embodiments, the textured polishing layer thickness may be greater than about 25 microns, greater than about 50 microns, greater than about 100 microns or even greater than 250 microns; less than about 20 mm, less than about 10 mm, less than about 5 mm or even less than about 2.5 mm. The shape of the textured polishing layer is not particularly limited. The layers may be fabricated such that the shape coincides with the shape of the corresponding platen of the polishing tool the pad will be attached to during use. Shapes, such as circular, square, hexagonal and the like may be used. A maximum dimension of the textured polishing layer, e.g. the diameter for a circular shaped layer, is not particularly limited. The maximum dimension of the layer may be greater than about 10 cm, greater than about 20 cm, greater than about 30 cm, greater than about 40 cm, greater than about 50 cm, greater than about 60 cm; less than about 2.0 meter, less than about 1.5 meter or even less than about 1.0 meter.

Figure 2:
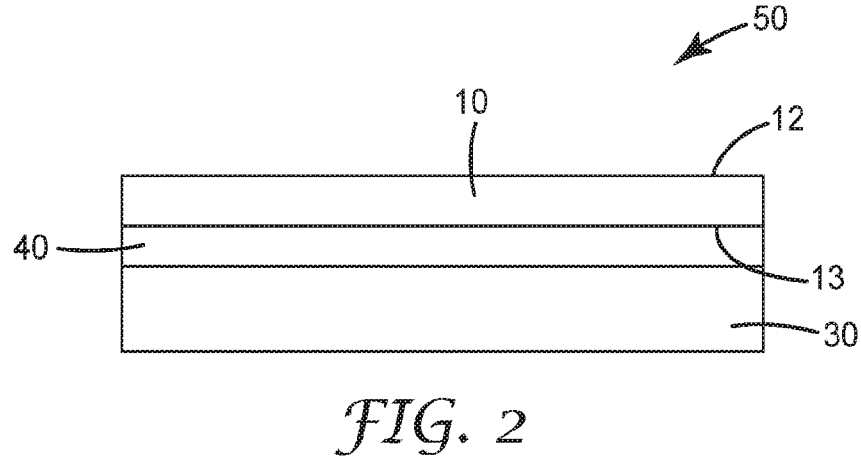
FIG. 2 is a schematic cross-sectional diagram of a polishing pad in accordance with some embodiments of the present disclosure.

FIG. 2 shows a polishing pad 50 which includes a textured polishing layer 10, having a working surface 12 and second surface 13 opposite working surface 12, and a subpad 30 adjacent to second surface 13. Optionally, a foam layer 40 is interposed between the second surface 13 of the textured polishing layer 10 and the subpad 30. The various layers of the polishing pad can be adhered together by any techniques known in the art, including using adhesives, e.g. pressure sensitive adhesives (PSAs), hot melt adhesives and cure in place adhesives. Use of a lamination process in conjunction with PSAs, e.g. PSA transfer tapes, is one particular process for adhering the various layers of polishing pad 50. Subpad 30 may be any of those known in the art. Subpad 30 may be a single layer of a relatively stiff material, e.g. polycarbonate, or a single layer of a relatively compressible material, e.g. an elastomeric foam. The subpad 30 may also have two or more layers and may include a substantially rigid layer and a substantially compressible layer. Foam layer 40 may have a durometer from between about 20 Shore D to about 90 Shore D. Foam layer 40 may have a thickness from between about 125 micron to about 5 mm or even between about 125 micron to about a 1,000 micron.

In some embodiments, the pad, including any one of textured polishing layer, the subpad, the optional foam layer, or any combination thereof, may include a window (i.e. a region allowing light to pass through, to enable standard endpoint detection techniques used in polishing processes (e.g. wafer endpoint detection)). The polishing pads of the present disclosure can be fabricated to run on such tools and endpoint detection windows which are configured to function with the polishing tool's endpoint detection system can be included in the polishing pad.

In some embodiments the present disclosure relates to a polishing system, the polishing system including any one of the previously discussed polishing pads or pad layers and a polishing solution. The polishing pads may include any of the previous disclosed textured polishing layers 10. The polishing solutions used are not particularly limited and may be any of those known in the art. In some embodiments, the polishing solution is a slurry, i.e. a liquid that contains organic or inorganic abrasive particles or combinations thereof. The concentration of organic or inorganic abrasive particles or combination thereof in the polishing solution is not particularly limited. The concentration of organic or inorganic abrasive particles or combinations thereof in the polishing solution may be greater than about 0.5%, greater than about 1%, greater than about 2%, greater than about 3%, greater than about 4% or even greater than about 5% by weight; may be less than about 30%, less than about 20% less than about 15% or even less than about 10% by weight. In some embodiments, the polishing solution is substantially free of organic or inorganic abrasive particles. By "substantially free of organic or inorganic abrasive particles" it is meant that the polishing solution contains less than about 0.5%, less than about 0.25%, less than about 0.1% or even less than about 0.05% by weight of organic or inorganic abrasive particles. In one embodiment, the polishing solution may contain no organic or inorganic abrasive particles. The polishing system may include polishing solutions, e.g. slurries, used for silicon oxide CMP, including but not limited to shallow trench isolation CMP; polishing solutions, e.g. slurries, used for metal CMP, including but not limited to tungsten CMP, copper CMP and aluminum CMP; polishing solutions, e.g. slurries, used for barrier CMP, including but not limited to tantalum and tantalum nitride CMP and polishing solutions, e.g. slurries, used for polishing hard substrates, such as, sapphire. The polishing system may further include a substrate to be polished or abraded.

Figure 3:
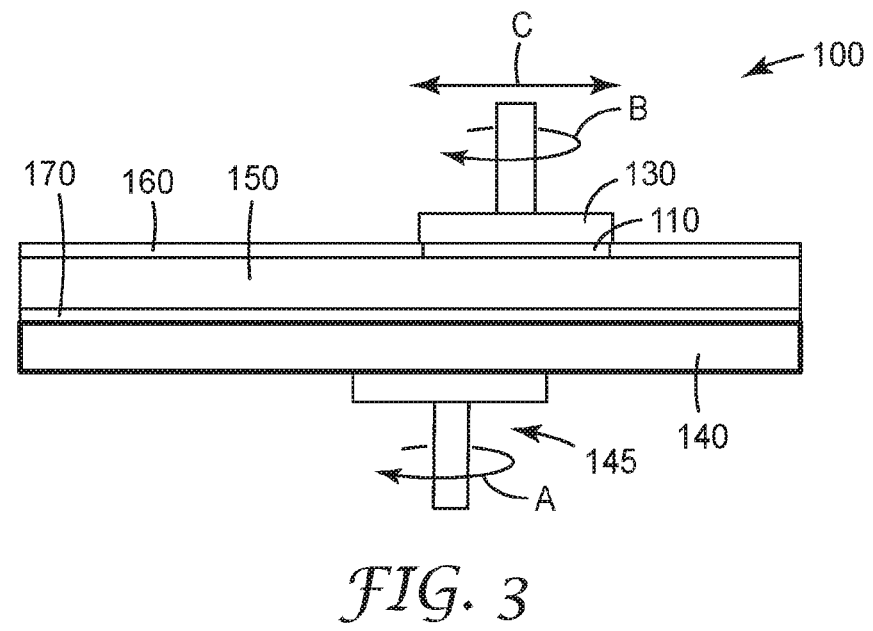
FIG. 3 illustrates a schematic diagram of an example of a polishing system for utilizing the polishing pads and methods in accordance with some embodiments of the present disclosure.

FIG. 3 schematically illustrates an example of a polishing system 100 for utilizing polishing pads and methods in accordance with some embodiments of the present disclosure. As shown, the system 100 may include a polishing pad 150 and a polishing solution 160. The system may further include one or more of the following: a substrate 110 to be polished or abraded, a platen 140 and a carrier assembly 130. An adhesive layer 170 may be used to attach the polishing pad 150 to platen 140 and may be part of the polishing system. Polishing solution 160 may be a layer of solution disposed about a major surface of the polishing pad 150. Polishing pad 150 includes a textured polishing layer (not shown) and may optionally include a subpad and/or foam layer, as described for the polishing pad 50 of FIG. 2. The polishing solution is typically disposed on the working surface of the textured polishing layer of the polishing pad. The polishing solution may also be at the interface between substrate 110 and polishing pad 150. During operation of the polishing system 100, a drive assembly 145 may rotate (arrow A) the platen 140 to move the polishing pad 150 to carry out a polishing operation. The polishing pad 150 and the polishing solution 160 may separately, or in combination, define a polishing environment that mechanically and/or chemically removes material from or polishes a major surface of a substrate 110. To polish the major surface of the substrate 110 with the polishing system 100, the carrier assembly 130 may urge substrate 110 against a polishing surface of the polishing pad 150 in the presence of the polishing solution 160. The platen 140 (and thus the polishing pad 150) and/or the carrier assembly 130 then move relative to one another to translate the substrate 110 across the polishing surface of the polishing pad 150. The carrier assembly 130 may rotate (arrow B) and optionally transverse laterally (arrow C). As a result, the textured polishing layer of polishing pad 150 removes material from the surface of the substrate 110. In some embodiments, inorganic abrasive material, e.g. inorganic abrasive particles, may be included in the textured polishing layer to facilitate material removal from the surface of the substrate. In other embodiments, the textured polishing layer is substantially free of any inorganic abrasive material and the polishing solution may be substantially free of organic or inorganic abrasive particle or may contain organic or inorganic abrasive particles or combination thereof. It is to be appreciated that the polishing system 100 of FIG. 3 is only one example of a polishing system that may be employed in connection with the polishing pads and methods of the present disclosure, and that other conventional polishing systems may be employed without deviating from the scope of the present disclosure.

In another embodiment, the present disclosure relates to a method of polishing a substrate, the method of polishing including: providing any of the previously discussed polishing pads or layers; providing a substrate; contacting the working surface of the polishing pad with the substrate surface, moving the polishing pad and the substrate relative to one another while maintain contact between the working surface of the polishing pad and the substrate surface, wherein polishing is optionally conducted in the presence of a polishing solution. In some embodiments, the polishing solution is a slurry and may include any of the previously discussed slurries. In another embodiment the present disclosure relates to any of the preceding methods of polishing a substrate, wherein the substrate is a semiconductor wafer. The materials comprising the semiconductor wafer to be polished may include, but are not limited to, at least one of a dielectric material, an electrically conductive material, a barrier/adhesion material and a cap material. The dielectric material may include at least one of an inorganic dielectric material, e.g. silicone oxide and other glasses, and an organic dielectric material. The metal material may include, but is not limited to, at least one of copper, tungsten, aluminum, silver and the like. The cap may include, but is not limited to, at least one of silicon carbide and silicon nitride. The barrier/adhesion material may include, but is not limited to, at least one of tantalum and tantalum nitride.

EXAMPLES

Unless otherwise noted or readily apparent from the context, all parts, percentages, ratios, etc. in the Examples and the rest of the specification are by weight.

| Abbreviation | Description and Source |
|---|---|
| ESTANE 58277 | Aromatic, polyester-based thermoplastic polyurethane obtained under the trade designation ESTANE 58277 from Lubrizol Corporation, Wickliffe, OH. |
| ESTANE ETE60DS3 | Aromatic, polyester-based thermoplastic polyurethane obtained under the trade designation ESTANE ETE60DS3 from Lubrizol Corporation. |
| DiARY MM9020 | Aromatic, polyether-based thermoplastic polyurethane obtained under the trade designation DiARY MM9020 from Diaplex Co. Ltd, Tokyo, Japan. |
| PELLETHANE 5855-70D | Aromatic, polyester-based thermoplastic polyurethane alloy obtained under the trade designation PELLETHANE 5855-70D from Lubrizol Corporation. |
| LUSTRAN SAN 31 | Styrene acrylonitrile resin with a melt flow rate of 7.5 g/10 min obtained under the trade designation LUSTRAN SAN 31 from Ineos-Styrolution, Frankfurt, Germany. |
| FOMREZ 44-160 | Poly(butylene adipate) polyol with a hydroxy number of 160 obtained under the trade designation FOMREZ 44-160 from Lanxess, Cologne, Germany. |
| FOMREZ G24-56 | Poly(ethylene-co-butylene adipate) polyol with a hydroxy number of 56 obtained under the trade designation FOMREZ G24-56 from Lanxess. |
| 1,4-BDO | 1,4-butanediol, obtained from BASF Corporation, Ludwigshafen, Germany. |
| DBTDL | Dibutyltin dilaurate, obtained from PMC Organometallix, Inc, Mount Laurel, NJ. |
| RUBINATE 1234 | MDI-based, low-functionality, polyester-based prepolymer with 18.9% NCO obtained under the trade designation RUBINATE 1234 from Huntsman Corporation, The Woodlands, TX. |
| ABS | Acrylonitrile butadiene styrene resin obtained under the trade designation LUSTRAN 1152 from Ineos-Styrolution. |
| PVB | Polyvinyl butyral obtained as Mowital B45H from Kuraray, Tokyo, Japan |
| PE | High density polyethylene with a melt index of 12 g/min obtained as product number 427985 from Sigma-Aldrich, St. Louis, MO. |
| PS | Polystyrene with an $M_W$ of 280,000 obtained as product number 18,242-7 from Sigma-Aldrich. |
| PVP | Polyvinylpyrrolidinone with an $M_W$ of 40,000 obtained as product number 8069 from Matheson Company, Norwood, OH. |

Test Methods

General Polymerization Method of Preparatory Examples 7-36 (PE 7 Through PE 36):

The polymer blends were prepared by reactive compounding of a mixture of polyol, chain extender, catalyst, isocyanate prepolymer, and styrenic polymer. The reactive mixtures were mixed for at least five minutes in a MC15 Micro Compounder (obtained from Xplore Instruments, Sittard, The Netherlands) at a temperature setting between 200° C. and 230° C. to allow polymerization to occur. Films were then pressed with a hydraulic press set at 375° F. (191° C.) to give films with a thickness between 0.3 mm and 0.8 mm. Formulations are on a weight basis.

Coefficient of Friction Test Method:

A film of a polymer blend was secured with tape to a horizontal polycarbonate platen. A stainless steel sled 2.5"× 2.5"×0.24" (6.35 cm×6.35 cm×0.61 cm) weighing 201.6 grams was placed on the surface of the film. One end of a cotton string was attached to the sled. The other end of the string was routed under a pully and fixed to the crosshead of an electromechanical test system (MTS Criterion Model 43, MTS Systems Corporation, Eden Prairie, MN). The crosshead was then moved at 1.2 inches/min (3.0 cm/min) for a total displacement of 5 inches (13 cm) such that the sled was pulled horizontally across the surface of the film for a distance of five inches (13 cm). The average load measured between 1.0 and 4.0 inches (2.5 and 10.2 cm) of displacement was divided by the weight of the sled to give a dynamic coefficient of friction (COF).

Shore D Hardness Test Method:

A sample of film of a polymer blend was folded onto itself until a total thickness of at least 1.5 mm was reached. This folded stack was then placed on top of a 2.8 mm thick sample of polyurethane with a hardness of 50 D such that a total stack of polyurethane of at least 4.2 mm was formed. A digital Shore D durometer (Phase II No. PHT-980, available from Cole Parmer, Vernon Hills, IL) was pressed onto the surface of the folded film and held for 2 seconds before reading the hardness.

Dynamic Mechanical Analysis (DMA) Test Method

A film sample was cut into a strip 6.2 mm wide and about 4 cm long. The thickness of the film was measured. The film was mounted in the tensile grips of an RSA-G2 DMA (TA Instruments, New Castle, DE, USA) with an initial grip separation of 25 mm. The film sample was then tested at an oscillation of 0.1% strain and 1 Hz throughout a temperature ramp from at least −20° C. to 150° C. at a rate of 3° C. per minute. The temperature at which the tan delta signal reached a maximum was recorded as the glass transition temperature, Tg.

300 mm Oxide Wafer Polishing Test Method

Wafers were polished using a CMP polisher available under the trade designation REFLEXION polisher from Applied Materials, Inc. of Santa Clara, CA The polisher was fitted with a 300 mm CONTOUR head for holding 300 mm diameter wafers. A 30.5 inch (77.5 cm) diameter film sample was laminated to a Poron subpad, available as 4701-60-20062004-54T-UR from Rogers Corporation, Chandler, AZ, This pad assembly was laminated to the platen of the polishing tool with a layer of PSA. The pad was broken in using a 12 psi (83 kPa). 2 minute retaining ring break-in. CONTOUR head pressures, platen and head RPMs are shown in Table 1. Wafers were polished at 3 psi for 1 minute. A brush type pad conditioner, available under the trade designation 3M CMP PAD CONDITIONER BRUSH PB33A, 4.25 in diameter available from the 3M Company, St. Paul, Minnesota was mounted on the conditioning arm and used at a speed of 108 rpm with a 3 lbf downforce. The pad conditioner was swept across the surface of the pad via a sinusoidal sweep at 19 swp/min, with 100% in-situ conditioning.

The polishing solution was a slurry, available under the trade designation SEIMICRON CES-333F-2.5 from Asahi Glass Co., LTD, Tokyo, Japan. Prior to use, the SEIMICRON CES-333F-2.5 slurry was diluted with DI water such that the final volume ratio of SEIMICRON CES-333F-2.5/DI water was 1/3. TOx monitor wafers were polished for 1 minute and subsequently measured. The average of four or five replicate rate wafers was reported. 300 mm diameter TOx monitor wafers were obtained from Advantiv Technologies Inc., Fremont, California. The wafer stack was as follows: 300 mm prime Si substrate+thermal oxide 20KA. 20 replicate thermal oxide wafers were used as "dummy" wafers, between monitor wafer polishing and were polished for 1 minute each. Four to five rate wafers were subsequently polished.

Removal rate was calculated by determining the change in thickness of the oxide layer being polished. This change in thickness was divided by the wafer polishing time to obtain the removal rate for the oxide layer being polished. Thickness measurements for 300 mm diameter wafers were taken with a NovaScan 3090Next 300, available from Nova Measuring Instruments, Rehovot, Israel. Sixty-five point diameter scans with 2 mm edge exclusion were employed.

Preparatory Examples

Preparatory Examples 1-30 (PE 1-PE 30) were prepared and tested as shown in Tables 1 through 5. The measured properties demonstrate how SAN blends affect the modulus and the stability of the modulus between 25° C. and 60° C. PE 1, PE 2, PE 3, PE 5 and PE 6 were made by pressing films from the as received materials. The blend of PE 4 was formed by standard melt mixing.

TABLE 1

| Preparatory Examples - Commercial Resins and Materials Properties | | | | | | |
|---|---|---|---|---|---|---|
| | PE 1 | PE 2 | PE 3 | PE 4 | PE 5 | PE 6 |
| Resin | Estane 58277 | Estane ETE60DS3 | DiARY MM9020 | 1:1 by wt. Estane 58277/ MM9020 | Pellethane 5855-70D | Lustran SAN 31 |
| SAN Content | — | — | — | — | 50 wt % | 100 wt % |
| Properties | | | | | | |
| E'25 (MPa) | 31 | 228 | 2288 | 1443 | 664 | 3105 |
| E'60 (MPa) | 16 | 63 | 1755 | 39 | 509 | 2792 |
| E'25/E'60 | 1.94 | 3.62 | 1.30 | 37.00 | 1.30 | 1.11 |
| COF | 0.55 | 0.33 | 0.22 | 0.20 | 0.2 | 0.25 |
| Shore D | 45 | 60 | 74 | 50 | 64 | 78 |
| $T_G1$ (° C.) | −0.8 | 22.3 | 90.9 | 47.5 | −5 | none |
| $T_G2$ (° C.) | None | None | None | None | 114.7 | 115.3 |

TABLE 2

| Preparatory Examples - Formulations and Materials Properties | | | | | | |
|---|---|---|---|---|---|---|
| Component | PE 7 | PE 8 | PE 9 | PE 10 | PE 11 | PE 12 |
| Lustran SAN 31 | 0.0% | 10.0% | 20.0% | 25.0% | 30.0% | 40.0% |
| Fomrez 44-160 | 39.3% | 35.4% | 31.4% | 29.5% | 27.5% | 23.6% |
| Fomrez G24-56 | — | — | — | — | — | — |
| 1,4-BDO | 6.2% | 5.6% | 5.0% | 4.7% | 4.4% | 3.7% |
| DBTDL | 0.011% | 0.009% | 0.008% | 0.009% | 0.009% | 0.008% |
| Rubinate 1234 | 54.5% | 49.0% | 43.6% | 40.9% | 38.1% | 32.7% |
| Properties | | | | | | |
| E'25 (MPa) | 21 | 58 | 141 | 166 | 141 | 603 |
| E'60 (MPa) | 12 | 27 | 71 | 80 | 83 | 426 |
| E'25/E'60 | 1.75 | 2.15 | 1.99 | 2.08 | 1.70 | 1.42 |
| COF | 0.83 | 0.43 | 0.4 | 0.38 | 0.4 | 0.19 |
| Shore D | 44 | 46 | 52 | 54 | 57 | 67 |
| $T_G1$ (° C.) | 0.7 | −2.9 | −3.0 | −3.5 | 0.9 | −4.9 |
| $T_G2$ (° C.) | None | 111.3 | 109.3 | 117.0 | 116.3 | 113.0 |

TABLE 3

| Preparatory Examples - Formulations and Materials Properties | | | | | | |
|---|---|---|---|---|---|---|
| Component | PE 13 | PE 14 | PE 15 | PE 16 | PE 17 | PE 18 |
| Lustran SAN 31 | 50.0% | 60.0% | 0.0% | 10.0% | 20.0% | 30.0% |
| Fomrez 44-160 | 19.6% | 15.7% | 32.4% | 29.2% | 25.9% | 22.7% |
| Fomrez G24-56 | — | — | — | — | — | — |
| 1,4-BDO | 3.1% | 2.5% | 8.1% | 7.3% | 6.5% | 5.7% |

TABLE 3-continued

| Preparatory Examples - Formulations and Materials Properties | | | | | | |
| --- | --- | --- | --- | --- | --- | --- |
| Component | PE 13 | PE 14 | PE 15 | PE 16 | PE 17 | PE 18 |
| DBTDL | 0.006% | 0.005% | 0.012% | 0.011% | 0.010% | 0.009% |
| Rubinate 1234 | 27.3% | 21.8% | 59.5% | 53.5% | 47.5% | 41.6% |
| Properties | | | | | | |
| E'25 (MPa) | 594 | 915 | 48 | 61 | 95 | 306 |
| E'60 (MPa) | 429 | 719 | 16 | 21 | 36 | 203 |
| E'25/E'60 | 1.38 | 1.27 | 3.00 | 2.90 | 2.64 | 1.51 |
| COF | 0.07 | 0.03 | 0.39 | 0.55 | 0.31 | 0.22 |
| Shore D | 60 | 61 | 48 | 53 | 57 | 54 |
| $T_G1$ (° C.) | −7.4 | −10.2 | 7.9 | 9.7 | 11.6 | 2.0 |
| $T_G2$ (° C.) | 110.7 | 109.9 | None | 133.9 | 121.3 | 109.6 |

TABLE 4

| Preparatory Examples - Formulations and Materials Properties | | | | | | |
| --- | --- | --- | --- | --- | --- | --- |
| Component | PE 19 | PE 20 | PE 21 | PE 22 | PE 23 | PE 24 |
| Lustran SAN 31 | 40.0% | 50.0% | 60.0% | 0.0% | 10.0% | 20.0% |
| Fomrez 44-160 | 19.4% | 16.2% | 13.0% | 25.5% | 23.0% | 20.4% |
| Fomrez G24-56 | — | — | — | — | — | — |
| 1,4-BDO | 4.9% | 4.1% | 3.3% | 10.1% | 9.1% | 8.1% |
| DBTDL | 0.007% | 0.006% | 0.004% | 0.012% | 0.011% | 0.009% |
| Rubinate 1234 | 35.7% | 29.8% | 23.8% | 64.4% | 58.0% | 51.5% |
| Properties | | | | | | |
| E'25 (MPa) | 568 | 882 | 1005 | 109 | 127 | 214 |
| E'60 (MPa) | 377 | 699 | 778 | 23 | 46 | 53 |
| E'25/E'60 | 1.51 | 1.26 | 1.29 | 4.74 | 2.76 | 4.04 |
| COF | 0.11 | 0.15 | 0.14 | 0.31 | 0.27 | 0.34 |
| Shore D | 57 | 60 | 63 | 53 | 60 | 62 |
| $T_G1$ (° C.) | −1.6 | −3.7 | −4.4 | 16.6 | 13.6 | 22.1 |
| $T_G2$ (° C.) | 109.7 | 110.9 | 110.5 | None | 119.7 | 117.9 |

TABLE 5

| Preparatory Examples - Formulations and Materials Properties | | | | | | |
| --- | --- | --- | --- | --- | --- | --- |
| Component | PE 25 | PE 26 | PE 27 | PE 28 | PE 29 | PE 30 |
| Lustran SAN 31 | 30.0% | 40.0% | 50.0% | 60.0% | 0.0% | 30.0% |
| Fomrez 44-160 | 17.9% | 15.3% | 12.7% | 10.2% | — | — |
| Fomrez G24-56 | — | — | — | — | 40.7% | 28.5% |
| 1,4-BDO | 7.1% | 6.0% | 5.0% | 4.0% | 8.6% | 6.0% |
| DBTDL | 0.009% | 0.008% | 0.005% | 0.004% | 0.011% | 0.008% |
| Rubinate 1234 | 45.1% | 38.7% | 32.2% | 25.8% | 50.7% | 35.4% |
| Properties | | | | | | |
| E'25 (MPa) | 439 | 676 | 843 | 1129 | 32 | 146 |
| E'60 (MPa) | 268 | 441 | 610 | 892 | 19 | 74 |
| E'25/E'60 | 1.64 | 1.53 | 1.38 | 1.27 | 1.68 | 1.97 |
| COF | 0.24 | 0.22 | 0.18 | 0.16 | 1.2 | 0.44 |
| Shore D | 65 | 60 | 66 | 66 | 38 | 50 |
| $T_G1$ (° C.) | 7.3 | 0.5 | 4.5 | −1.6 | −9.4 | −9.9 |
| $T_G2$ (° C.) | 112.2 | 108.8 | 110.0 | 110.3 | none | 116.3 |

Preparatory Examples 31-36 were prepared and tested as shown in Tables 6. The measured properties demonstrate how SAN and ABS affect the modulus and the stability of the modulus between 25° C. and 60° C. in comparison to blends with other polymers. The domain sizes in Preparatory Examples 31-36 were analyzed by scanning electron microscopy. Samples of the films were submerged in liquid nitrogen and fractured. The fractured samples were then submerged in MEK for 30 minutes to dissolve SAN, ABS, and polystyrene. The fracture surfaces were then imaged and domain size was indicated by the voids left. In the case of polyethylene, the polyethylene domains are visible in the image without needing to be dissolved. The domains from ABS and SAN are generally between 1 micron and 5 microns, which is small compared to the polyethylene and polystyrene domains, which show a substantial fraction of domains larger than 5 microns. The polyvinylpryolidinone did not show and discrete domains.

TABLE 6

| Preparatory Examples - Blends of 75 wt. % Estane 58277 and 25 wt. % Additional Resin | | | | | | |
|---|---|---|---|---|---|---|
| | Prep. Example | | | | | |
| | PE 31 | PE 32 | PE33 [a] | PE 34 | PE 35 | PE 36 |
| Additional Resin | SAN 31 | ABS | PVB | PE | PS | PVP |
| Properties | | | | | | |
| Tens. Strength (MPa) | 33.4 | 28.6 | — | 19.0 | 22.9 | 16.5 |
| E'25 (MPa) | 129 | 119.9 | — | 113 | 139 | 400 |
| E'60 (MPa) | 52 | 65.8 | — | 41 | 53 | 27 |
| E'25/E'60 | 2.47 | 1.82 | — | 2.73 | 2.64 | 14.88 |
| COF | 0.41 | 0.26 | — | 0.29 | 0.36 | 0.25 |
| Shore D | 48 | 45 | 41 | 40 | 46 | 44 |
| Tg1 (° C.) | 7.3 | 6.6 | — | 8.0 | 8.4 | 78.6 |
| Tg2 (° C.) | 119.5 | 111.3 | — | none | 117.9 | none |

[a] PE 33 formed from a brittle material that fractured rather than flowed in the hydraulic press Preparatory Examples 37 and 38 were prepared by compounding Lustran SAN 31 and Estane 58277 in a twin screw extruder, model DTEX58 from David Standard, Pawcatuck, CT, with an L/D of 42.5 and operated at 300 lbs/h with a screw speed of 300 RPM and a melt temperature between 400° F. (204° C.) and 480° F. (249° C.). The resulting polymer melt was pelletized using an underwater pelletizer. For Preparatory Example 37, 10 wt % Lustran SAN 31 was blended with 90 wt % Estane 58277. The resulting blend had an E'25 of 58.4 MPa, and E'60 of 28.8 MPa, and an E'25/E'60 of 2.03. For Preparatory Example 38, 30 wt % Lustran SAN 31 was blended with 70 wt % Estane 58277. The resulting blend had an E'25 of 118.2 MPa, and E'60 of 60.6 MPa, and an E'25/E'60 of 1.95.

EXAMPLES

Microreplicated CMP pads were prepared by embossing polyurethane-based materials using a process similar to that described in Example 2 of U.S. Pat. No. 10,071,461, which is incorporated herein by reference. The polishing layer of Example 1 was made from Pellethane 5855 70D. Based on NMR analysis, Pellethane 5855 70D is a blend of 50 wt % SAN resin with 50 wt % polyurethane. The polishing layers of Examples 2, 4, and 5 were produced by reactively extruding the formulation, see Table 7, in a co-rotating twin screw extruder as generally described in Example 1 of U.S. Pat. No. 8,128,779, which is incorporated herein by reference. Comparative Example 3 (CE 3) was a commercially available foam-based CMP pad, an IC1010 pad obtained from Dow Chemical Company, Midland, MI. The pads were tested according to the previously described 300 mm Oxide Wafer Polishing Test Method. The oxide removal rate results are summarized in Table 8. Examples 7 and 8 were made with Preparatory Examples 37 and 38, respectively.

TABLE 7

| Formulations of Examples | | | | |
|---|---|---|---|---|
| | Ex. 2 (wt. %) | Ex. 4 (wt. %) | Ex. 5 (wt. %) | Ex. 6 (wt. %) |
| Lustran SAN 31 | 25.0 | 14 | 27 | 29 |
| Fomrez 44-160 | 29.5 | 33.8 | 28.7 | 27.9 |
| 1,4-BDO | 4.7 | 5.5 | 4.6 | 4.5 |
| DBTDL | 0.011 | 0.017 | 0.015 | 0.014 |

TABLE 7-continued

| Formulations of Examples | | | | |
|---|---|---|---|---|
| | Ex. 2 (wt. %) | Ex. 4 (wt. %) | Ex. 5 (wt. %) | Ex. 6 (wt. %) |
| Rubinate 1234 | 40.9 | 46.7 | 39.6 | 38.5 |
| E'25 (MPa) | | 20.32 | 39.19 | 55.81 |
| E'60 (MPa) | | 11.56 | 22.43 | 31.78 |
| E'25/E'60 | | 1.76 | 1.75 | 1.76 |

TABLE 8

| Example | Mean Oxide Removal Rate (Angstroms/minute) |
|---|---|
| Example 1 | 1348 |
| Example 2 | 2239 |
| CE 3 | 1171 |
| Example 7 | 2350 |
| Example 8 | 3526 |

What is claimed is:

1. A polishing pad comprising:
a textured polishing layer comprising a working surface and a second surface opposite the working surface;
wherein the textured polishing layer comprises a polymeric blend comprising thermoplastic urethane in an amount of between 40 and 95 wt. %, and styrenic copolymer in an amount of between 5 and 60 wt. %, based on the total weight of the textured polishing layer;
wherein the styrenic polymers exist in separate domains from the thermoplastic urethanes, such that the glass transition temperature of the thermoplastic urethanes and the glass transition of the styrenic polymer are both present in the polymeric blend, wherein the glass transition temperature of the thermoplastic urethanes is below 25 degrees C. and the glass transition temperature of the styrenic polymers is above 60 degrees C.

2. The polishing pad of claim 1, wherein the styrenic copolymer comprises styrene acrylonitrile polymers or acrylonitrile butadiene styrene copolymers.

3. The polishing pad of claim 1, wherein the polymeric blend has an E'25/E'60 of less than 3.0 and a tensile moduli between 30 MPa and 1000 MPa in the temperature range of 25° C. to 60° C. as measured by DMTA at 1 hertz.

4. The polishing pad of claim 1, wherein the working surface includes a plurality of precisely shaped pores, a plurality of precisely shaped asperities, or a plurality of precisely shaped asperities and a plurality of precisely shaped pores.

5. The polishing pad of claim 1, wherein the textured polishing layer is formed as a material having a porosity of between 30% and 70%.

6. The polishing pad of claim 1, further comprising a subpad, wherein the second surface of the textured polishing layer is adjacent to the subpad.

7. The polishing pad of claim 6, further comprising a foam layer, wherein the foam layer is interposed between the second surface of the textured polishing layer and the subpad.

8. A polishing system comprising the polishing pad of claim 1 and a polishing solution.

9. The polishing system of claim 8, wherein the polishing solution is a slurry.

10. A method of polishing a substrate, the method comprising:

providing a polishing pad according to claim 1;

providing a substrate;

contacting the working surface of the polishing pad with the substrate surface;

moving the polishing pad and the substrate relative to one another while maintaining contact between the working surface of the polishing pad and the substrate surface, wherein polishing is conducted in the presence of a polishing solution.

11. The method of polishing a substrate of claim 10, wherein the polishing solution is a slurry.

12. The method of polishing a substrate of claim 10, wherein the substrate is a semiconductor wafer.

13. The method of polishing a substrate of claim 12, wherein the semiconductor wafer surface being polished includes at least one of a dielectric material and an electrically conductive material.

* * * * *